US012635100B2

(12) United States Patent　　　　(10) Patent No.:　US 12,635,100 B2
Gupta et al.　　　　　　　　　　　　(45) Date of Patent:　May 19, 2026

(54) ADAPTIVE CHASSIS DESIGN ACCOMMODATING MULTI FORM FACTOR PLUGGABLE MODULES IN NETWORK APPLICATIONS

(71) Applicant: Ciena Corporation, Hanover, MD (US)

(72) Inventors: Chander Prakash Gupta, Gurugram (IN); Sachin Singla, Gurugram (IN); Suyash Agrawal, Gurugram (IN); Karan Goel, Gurugram (IN)

(73) Assignee: Ciena Corporation, Hanover, MD (US)

( * ) Notice: Subject to any disclaimer, the term of this patent is extended or adjusted under 35 U.S.C. 154(b) by 393 days.

(21) Appl. No.: 18/228,133

(22) Filed: Jul. 31, 2023

(65) Prior Publication Data

US 2024/0422933 A1　Dec. 19, 2024

(30) Foreign Application Priority Data

Jun. 17, 2023　(IN) .............................. 202311041260

(51) Int. Cl.
H05K 7/14　　　　(2006.01)
(52) U.S. Cl.
CPC ......... H05K 7/1418 (2013.01); H05K 7/1445 (2013.01); H05K 2201/10189 (2013.01)
(58) Field of Classification Search
None
See application file for complete search history.

(56) References Cited

U.S. PATENT DOCUMENTS

| | | | |
|---|---|---|---|
| 7,193,845 B2 * | 3/2007 | Titus | G06F 1/187 |
| | | | 455/550.1 |
| 11,452,241 B2 * | 9/2022 | Tufty | H05K 7/1492 |
| 2017/0293098 A1 * | 10/2017 | Lee | G02B 6/44526 |
| 2022/0130288 A1 * | 4/2022 | Park | G06F 1/1681 |

FOREIGN PATENT DOCUMENTS

WO　　WO-2022042063 A1 *　3/2022 ........... G06F 1/1652

* cited by examiner

*Primary Examiner* — Allen L Parker
*Assistant Examiner* — Elisa Sasserath
(74) *Attorney, Agent, or Firm* — Clements Bernard Walker; Christopher L. Bernard

(57)　　　　　　ABSTRACT

A chassis design and methodology providing for the use of multiple power supply unit and other module form factors without chassis redesign. This increases usable life and future upgradability (in terms of power, for example) for network platforms. The chassis design utilizes a power supply unit or other module slot that includes a width adjustment mechanism, such as a scissor mechanism. The chassis design utilizes variable mounting holes and a movable backplane printed circuit board assembly and edge connector for accommodating various power supply unit or other module lengths. Thus, an adaptive chassis design accommodating multi form factor pluggable modules in network applications, such as multi form factor pluggable power supply units in high power network applications, is provided.

20 Claims, 9 Drawing Sheets

ADAPTIVE CHASSIS DESIGN ACCOMMODATING MULTI FORM FACTOR PLUGGABLE MODULES IN NETWORK APPLICATIONS

CROSS-REFERENCE TO RELATED APPLICATION

The present disclosure claims the benefit of priority of co-pending Indian Patent Application No. 202311041260, filed on Jun. 17, 2023, and entitled "ADAPTIVE CHASSIS DESIGN ACCOMMODATING MULTI FORM FACTOR PLUGGABLE MODULES IN NETWORK APPLICA-TIONS," the contents of which are incorporated in full by reference herein.

TECHNICAL FIELD

The present disclosure relates generally to the network and telecommunication fields. More particularly, the present disclosure relates to an adaptive chassis design accommo-dating multi form factor pluggable modules in network applications, such as multi form factor pluggable power supply units (PSUs) in high power network applications.

BACKGROUND

Field replaceable (FR) pluggable PSUs are used in 1 rack unit (RU) and 2 RU network equipment for quick replace-ment in case of failure and to enable redundant operation to ensure zero network downtime. Such PSUs come in various sizes (length and width) standardized by the Modular Hard-ware System Common Redundant Power Supply (M-CRPS) Base Specification or otherwise. For example, the PSUs may have form factors that include 185×73.5 mm (length×width) or 185×60 mm (length×width). Both come in 1 RU height and have different input connector types and voltage ranges, such as 240 VAC/240 VDC, 277 VAC/380 VDC, +54 VDC for rack input power using a bus bar connector, and −48 VDC input for the telecommunication industry.

Conventionally, a chassis in a system can accommodate a fixed PSU size that is predetermined by estimating approxi-mate power budget based on existing available optics appli-cation specific integrated circuits (ASICs). This is limit-ing—requiring chassis redesign if different PSUs are to be accommodated.

If new higher power optics are launched and power exceeds the power budget of a given PSU, a chassis redesign is required to accommodate a larger higher power PSU. This significantly increases time, cost, and compliance risks due to redesign. During testing, it sometime happens that power budget was overestimated, and a smaller lower power PSU could have been used, which would save cost and provide improved thermals, reduced electromagnetic interference (EMI), and lower fan noise if chassis redesign was not required. When more power efficient ASICs are launched that are footprint compatible with existing ASICs used in the system, there is an option to swap a smaller lower power PSU if chassis redesign is not required.

The present background is provided as illustrative envi-ronmental context only and should not be construed to be limiting in any manner. It will be readily apparent to those of ordinary skill in the art that the concepts and principles of the present disclosure may be implemented in other envi-ronmental contexts equally.

BRIEF SUMMARY

The present disclosure provides a chassis design and methodology providing for the use of multiple PSU and other module form factors without chassis redesign. This increases usable life and future upgradability (in terms of power, for example) for network platforms. The chassis design of the present disclosure utilizes a PSU or other module slot that includes a width adjustment mechanism, such as a scissor mechanism. The chassis design utilizes variable mounting holes and a movable backplane printed circuit board assembly (PCBA) and edge connector for accommodating various PSU or other module lengths. Thus, the present disclosure provides an adaptive chassis design accommodating multi form factor pluggable modules in network applications, such as multi form factor pluggable PSUs in high power network applications.

In one illustrative embodiment, the present disclosure provides a chassis assembly for network equipment, the chassis assembly including a module slot including a bottom wall, a top wall, and a pair of side walls adapted to receive a module therein and an adjustment mechanism adapted to translate at least one of the pair of side walls laterally to adjust a width of the module slot to conform to a width of the module. Optionally, one or more of the bottom wall and the top wall is a partial wall that is translated with the at least one of the pair of side walls. In this embodiment, the adjustment mechanism is a scissor mechanism including a first scissor link pivotably coupled to a second scissor link. One end of the first scissor link is pivotably and longitudi-nally translatably coupled to a guide rail coupled to the at least one of the pair of side walls and another end of the first scissor link is pivotably coupled to the chassis assembly. One end of the second scissor link is pivotably and longi-tudinally translatably coupled to the chassis assembly and another end of the second scissor link is pivotably coupled to the guide rail coupled to the at least one of the pair of side walls. The one end of the second scissor link is pivotably and longitudinally translatably coupled to the chassis assembly via a thumb screw and a support bracket, where the support bracket is adapted to convert rotational motion of the thumb screw to longitudinal translational motion of the one end of the second scissor link. The module slot further includes a backplane printed circuit board assembly and an edge con-nector adapted to receive a module connector disposed at a rear portion of the module. A chassis structure forming a bottom of the module slot defines multiple rows of holes adapted to receive the backplane printed circuit board assembly and the edge connector at different depths within the module slot.

In another illustrative embodiment, the present disclosure provides a chassis assembly for network equipment, the chassis assembly including a module slot including a bottom wall, a top wall, and a pair of side walls adapted to receive a module therein, an adjustment mechanism adapted to translate at least one of the pair of side walls laterally to adjust a width of the module slot to conform to a width of the module, and a backplane printed circuit board assembly and an edge connector adapted to receive a module connec-tor disposed at a rear portion of the module, where the backplane printed circuit board assembly and the edge connector are adapted be moved longitudinally to adjust a depth of the module slot to conform to a depth of the module. Optionally, one or more of the bottom wall and the top wall is a partial wall that is translated with the at least one of the pair of side walls. In this embodiment, the adjustment mechanism is a scissor mechanism including a first scissor link pivotably coupled to a second scissor link. One end of the first scissor link is pivotably and longitudi-nally translatably coupled to a guide rail coupled to the at least one of the pair of side walls and another end of the first scissor link is pivotably coupled to the chassis assembly. One end of the second scissor link is pivotably and longitudinally translatably coupled to the chassis assembly and another end of the second scissor link is pivotably coupled to the guide rail coupled to the at least one of the pair of side walls. The one end of the second scissor link is pivotably and longitudinally translatably coupled to the chassis assembly via a thumb screw and a support bracket, where the support bracket is adapted to convert rotational motion of the thumb screw to longitudinal translational motion of the one end of the second scissor link. A chassis structure forming a bottom of the module slot defines multiple rows of holes adapted to receive the backplane printed circuit board assembly and the edge connector at different depths within the module slot.

In a further illustrative embodiment, the present disclosure provides a method including receiving a module in a module slot of a chassis assembly, where the module slot includes a bottom wall, a top wall, and a pair of side walls and adjusting, based on a width of the module, a width of the module slot using an adjustment mechanism adapted to translate at least one of the pair of side walls laterally. In this embodiment, the adjustment mechanism is a scissor mechanism including a first scissor link pivotably coupled to a second scissor link. One end of the first scissor link is pivotably and longitudinally translatably coupled to a guide rail coupled to the at least one of the pair of side walls and another end of the first scissor link is pivotably coupled to the chassis assembly. One end of the second scissor link is pivotably and longitudinally translatably coupled to the chassis assembly and another end of the second scissor link is pivotably coupled to the guide rail coupled to the at least one of the pair of side walls. The one end of the second scissor link is pivotably and longitudinally translatably coupled to the chassis assembly via a thumb screw and a support bracket, where the support bracket is adapted to convert rotational motion of the thumb screw to longitudinal translational motion of the one end of the second scissor link. In this embodiment, the module is a power supply unit configured to fulfill a power requirement of network equipment. An amount of the adjustment of the width of the module slot is based on a size of the power supply unit and the size of the power supply unit is based on the power requirement of the network equipment.

BRIEF DESCRIPTION OF THE DRAWINGS

The present disclosure is illustrated and described with reference to the various drawings, in which like reference numbers are used to denote like assembly components and method steps, as appropriate, and in which.

It will be readily apparent to those of ordinary skill in the art that aspects and features of the illustrated embodiments may be included, omitted, and combined as desired in a given application without limitation.

DETAILED DESCRIPTION

Again, the present disclosure provides a chassis design and methodology providing for the use of multiple PSU and other module form factors without chassis redesign. This increases usable life and future upgradability (in terms of power, for example) for network platforms. The chassis design of the present disclosure utilizes a PSU or other module slot that includes a width adjustment mechanism, such as a scissor mechanism. The chassis design utilizes variable mounting holes and a movable backplane PCBA and edge connector for accommodating various PSU or other module lengths. Thus, the present disclosure provides an adaptive chassis design accommodating multi form factor pluggable modules in network applications, such as multi form factor pluggable PSUs in high power network applications.

Figure 1:
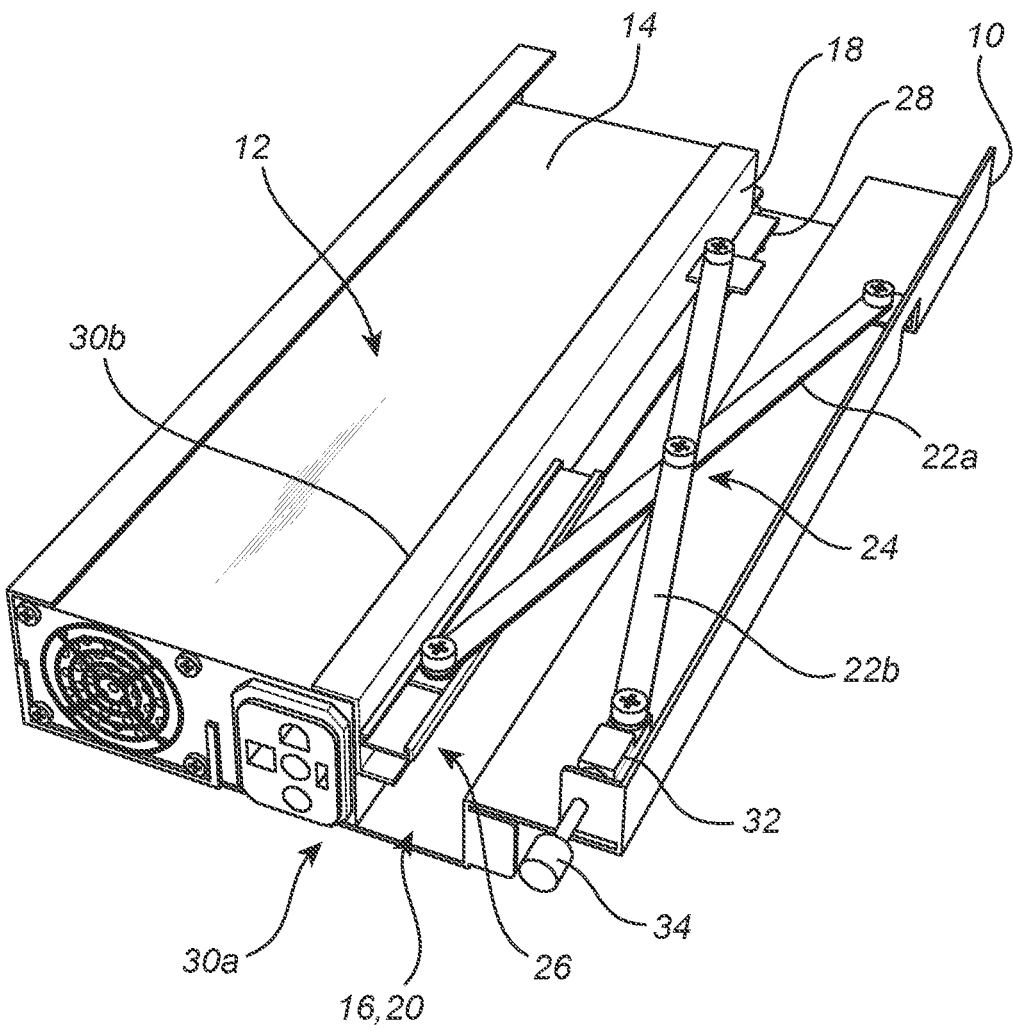
FIG. 1 is a partial perspective view of one embodiment of the chassis assembly, adjustable module slot, and adjustment mechanism of the present disclosure, with an associated module inserted into the module slot.

Referring now specifically to FIG. 1, the chassis assembly 10 of the present disclosure utilizes a module slot 12 that may be adjusted to accommodate different sized modules 14, such as a PSUs or the like. For example, one (lower power, for example) module 14 may be more narrow with a shorter depth, while another (higher power, for example) module 14 may be wider with a longer depth. The adjustable module slot 12 of the chassis assembly 10 of the present disclosure allows these modules 14 to be alternatively accommodated without a redesign of the chassis assembly 10. In general, the chassis assembly 10 is manufactured from a metal or other suitable rigid material, and the adjustable module slot 12 includes bottom, top, and left and right side surfaces forming a cage that is adapted to receive the module 14 therein. The module 14 typically includes a box structure that is sized to fit within the adjustable module slot 12 in a given configuration.

The adjustable module slot 12 is a adjusted width-wise via an adjustment mechanism 16 incorporated into one side of the module slot 12. Actuation of the adjustment mechanism 16 causes a side wall 18 of the module slot 12 to be translated laterally with respect to the chassis assembly 10, thereby making the module slot 12 more narrow or wider as desired. It will be readily apparent to those of ordinary skill in the art that the adjustment mechanism 16 may be applied to the left side wall 18 of the module slot 12 and/or the right side wall 18 of the module slot 12. If a partial bottom wall and/or top wall is/are utilized, this partial bottom wall and/or top wall may be translated laterally with respect to the chassis assembly 10 with the side wall(s) 18. As used herein, "laterally" refers to side-to-side movement parallel to a front surface of the chassis assembly 10 and the opening of the module slot 12. It will be readily apparent to those of ordinary skill in the art that similar vertical adjustment could be provided as well if desired.

In the embodiment illustrated, the adjustment mechanism 16 includes a scissor mechanism 20, but it will be readily apparent to those of ordinary skill in the art that other similar types of adjustment mechanisms may be used equally. The scissor mechanism 20 includes a pair of scissor links 22a and 22b joined at a central pivot 24. One end of the first scissor link 22a is pivotably coupled to a slider 26 that is able to translate longitudinally along a guide rail 28 coupled to the translating side wall 18 of the module slot 12. As used herein, "longitudinally" refers to front-to-back movement perpendicular to the front surface of the chassis assembly 10 and the opening of the module slot 12. As illustrated, the translating side wall 18 includes a partial bottom wall 30a and partial top wall 30b that constrain the retained module 14 and are translated laterally with respect to the chassis assembly 10 with the side wall 18. Another end of the first scissor link 22a is pivotably coupled to the chassis assembly 10 outside the cage of the module slot 12. One end of the second scissor link 22b is pivotably coupled to a support bracket 32 that is able to translate longitudinally with rotation of a thumb screw 34 disposed through/proximate the front surface of the chassis assembly 10 outside the cage of the module slot 12. The support bracket 32 is adapted to convert rotational motion of the thumb screw 34 to longitudinal translational motion of the one end of the second scissor link 22b. Another end of the second scissor link 22b is pivotably coupled to the guide rail 28 coupled to the translating side wall 18 of the module slot 12 or a tab of the side wall 18 itself. Thus, each of the scissor links 22a and 22b is coupled and extensible between the chassis assembly 10 and the translating side wall 18 of the module slot 12. With one point of contact of each of the scissor links 22a and 22b being pivotable but fixed and one point of contact of each of the scissor links 22a and 22b being pivotable and translatable. One of these translatable points of contact is actuatable by the thumb screw 34, or a similar translation mechanism, and the other of these translatable points of contact is a passive follower.

Thus, the chassis assembly 10 utilizes a module slot 12 that includes a width adjustment mechanism 16, such as this scissor mechanism 20, that allows for different modules 14 to be accommodated and received in different desired applications.

In terms of assembly procedure, the guide rail 28 with the slider 26 is typically bolted to the associated side wall 18 with flathead screws or the like, the slider 26 freely translating longitudinally along the guide rail 28. The first scissor link 22a is then bolted between the slider 26 and the chassis assembly 10 with pivot bolts or the like. Center holes of the first scissor link 22a and second scissor link 22b are then lined up and joined together using a pivot bolt or the like. The second scissor link 22b is then bolted between the support bracket 32 and the guide rail 28 or side wall 18 with pivot bolts or the like. The thumb screw 34 is then threaded through the front of the chassis assembly 10 and into the support bracket 32, and optionally held in place via a lock nut or the like. It should be noted that the support bracket 32 may be constrained to longitudinal translation when the thumb screw 34 is actuated, thereby providing desired mechanical stability of the adjustment mechanism 16.

Figure 2:
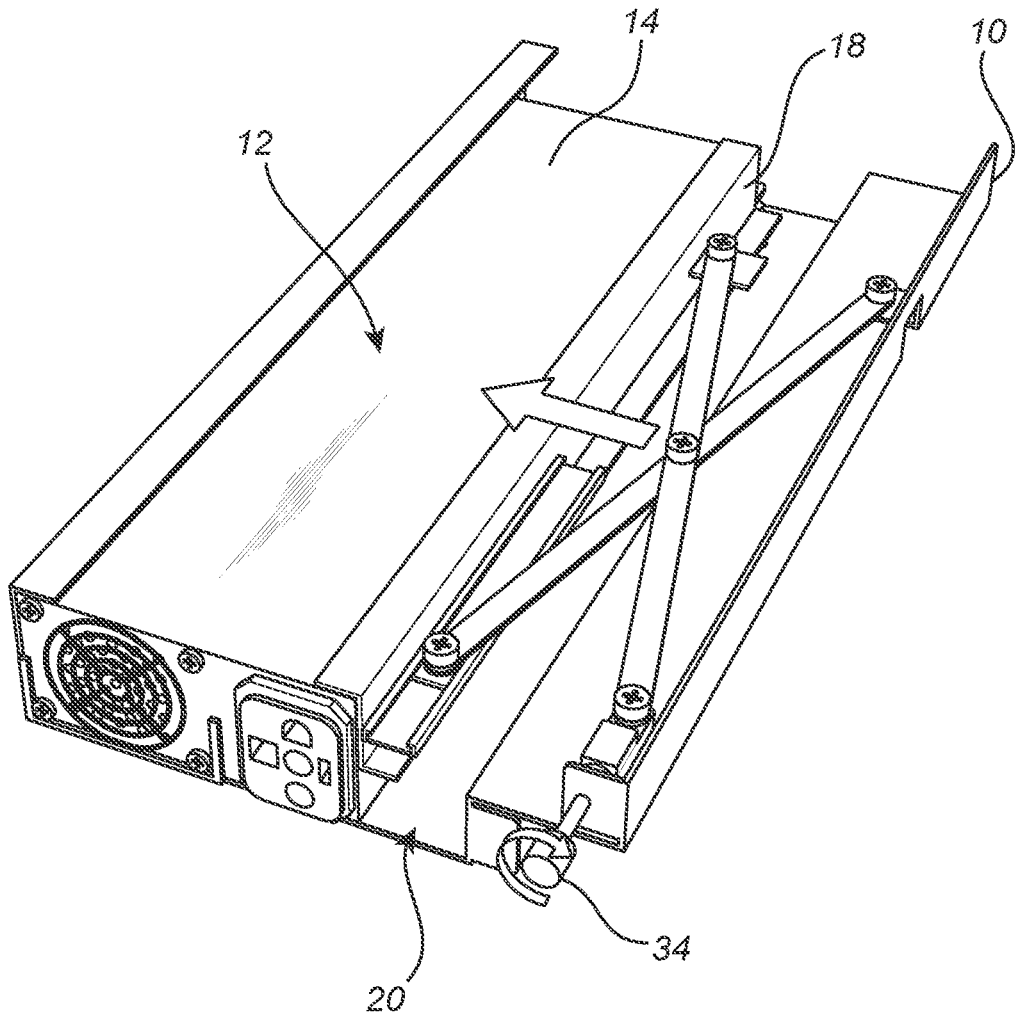
FIG. 2 is a partial perspective view of one embodiment of the chassis assembly, adjustable module slot, and adjustment mechanism of the present disclosure, with a smaller module inserted into the module slot.
Figure 3:
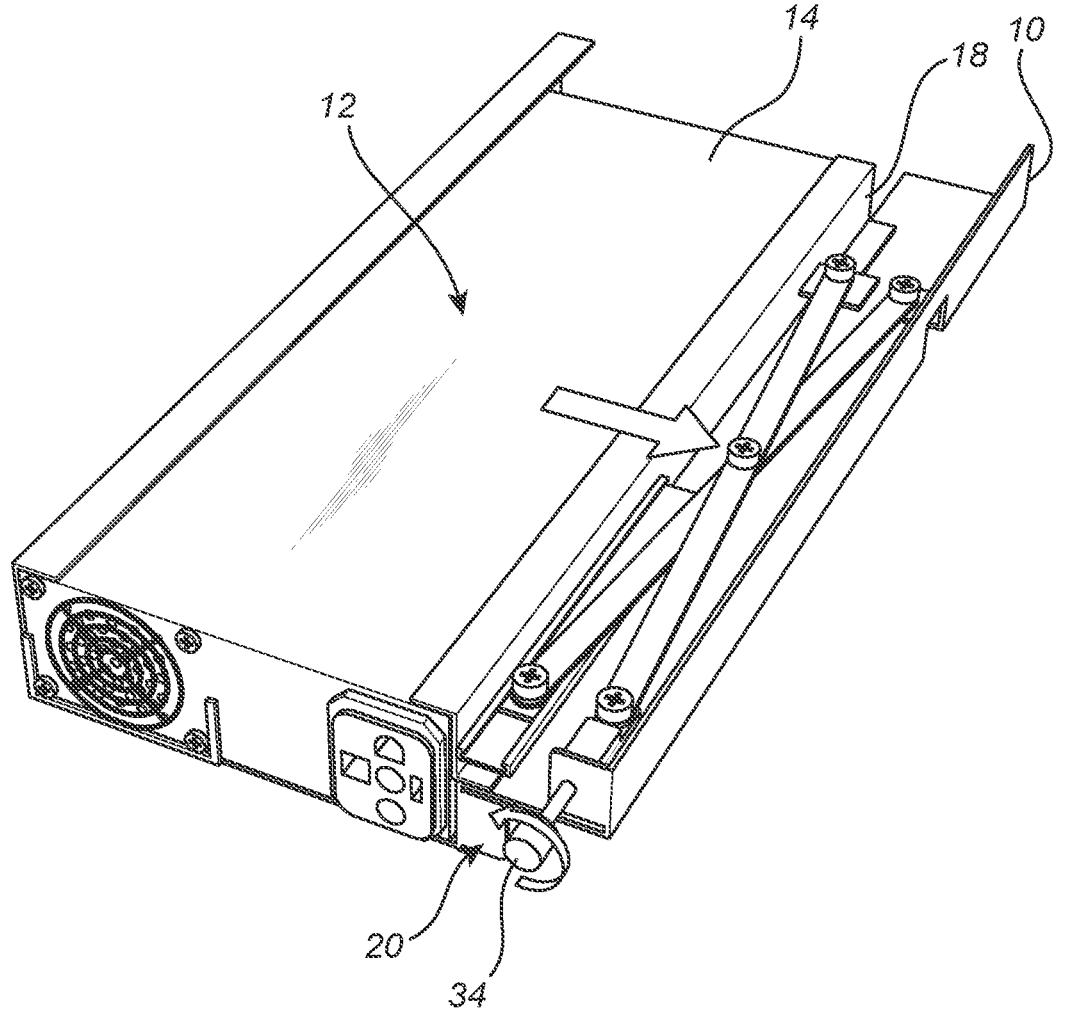
FIG. 3 is a partial perspective view of one embodiment of the chassis assembly, adjustable module slot, and adjustment mechanism of the present disclosure, with a larger module inserted into the module slot.

Referring now specifically to FIGS. 2 and 3, by rotating the thumb screw 34 of the scissor mechanism 20 in a clockwise direction, the side wall 18 of the module slot 12 is translated laterally inwards, making the module slot 12 more narrow and accommodating a more narrow module 14 (such as a PSU) in the chassis assembly 10. By rotating the thumb screw 34 of the scissor mechanism 20 in a counterclockwise direction, the side wall 18 of the module slot 12 is translated laterally outwards, making the module slot 12 wider and accommodating a wider module 14 (such as a PSU) in the chassis assembly 10. As illustrated, the height of all modules 12 is the same. It will be readily apparent to those of ordinary skill in the art that similar vertical adjustment could be provided as well if desired.

As alluded to above, the adjustable module slot 12 of the chassis assembly 10 of the present disclosure is also able to accommodate different module depths.

Figure 4:
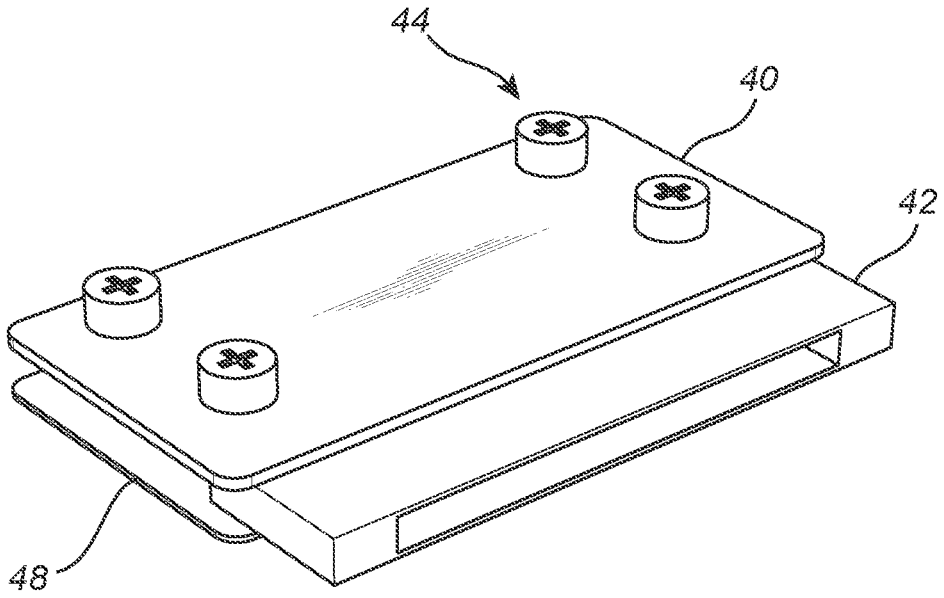
FIG. 4 is perspective and partial perspective views of the backplane PCBA and edge connector of the chassis assembly of the present disclosure.
Figure 4:
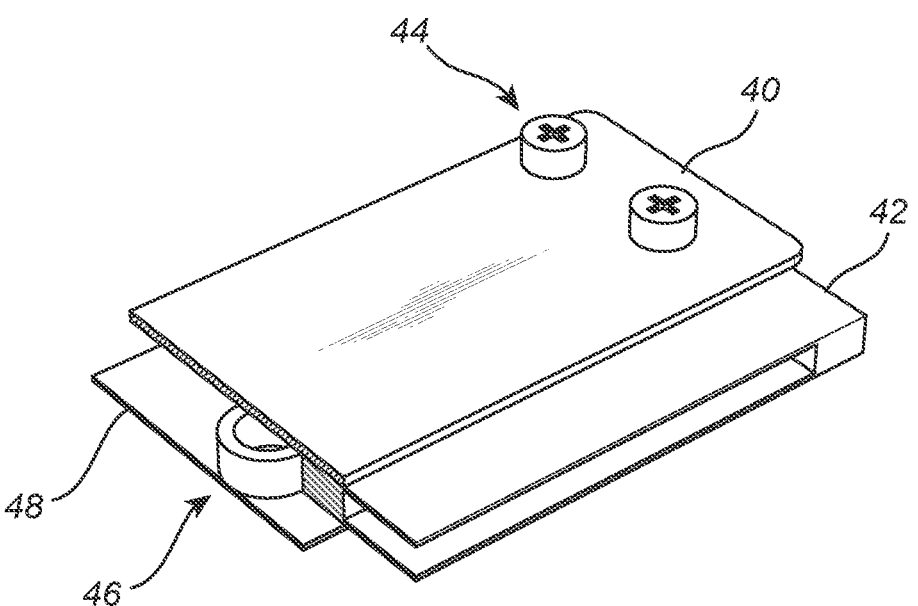

Referring now specifically to FIG. 4, the module 14 plugs to a backplane PCBA 40 through an edge connector 42. For different width and depth modules 14, edge connector size and position can be different. Thus, edge connector adjustment is required to accommodate different modules 14. As is illustrated, the edge connector 42 is coupled to the backplane PCBA 40 via a plurality of bolts 44, such that the lateral and vertical position of the edge connector 42 is proper when the associated module 14 is inserted into the properly adjusted module slot 12. However, the proper edge connector depth must be provided in a manner that obviates the need for chassis redesign for different modules 14. The backplane PCBA 40 also includes a plurality of clinch nuts 46 adapted to receive a plurality of screws for coupling the backplane PCBA 40 and edge connector 42 to the chassis assembly 10.

Figure 5:
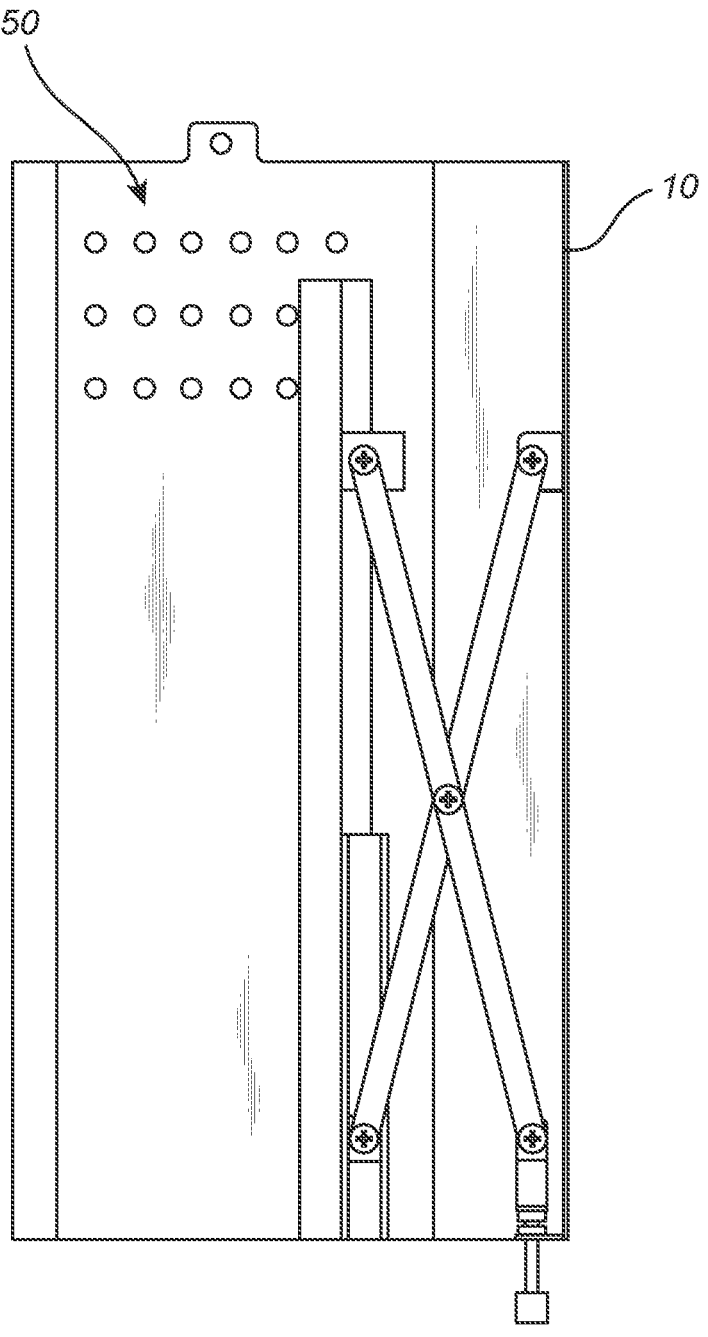
FIG. 5 is a planar view of multiple rows of holes formed in a surface of the chassis assembly of the present disclosure for coupling the backplane PCBA and edge connector to the chassis assembly.

Referring now specifically to FIG. 5, the chassis assembly 10 includes multiple rows of holes 50 in the area where the backplane PCBA 40 and edge connector 42 are to be attached. These rows of holes 50 allow for backplane PCBA and edge connector attachment that is longitudinally deeper to accommodate a deeper module 14 or longitudinally more shallow to accommodate a more shallow module 14. In general, the rows of holes 50 are formed in the bottom wall of the module slot area.

In terms of assembly procedure, the backplane PCBA 40 is mounted over a support plate 48 using threaded stand-offs associated with the bolts 44. The backplane PCBA and support plate assembly is then placed on the chassis assembly 10. Flathead screws are assembled through the appropriate holes 50 of chassis assembly 10 from the bottom side, to the clinch nuts 46 of the support plate 48. Again, the grid of holes 50 provides different mounting positions where the backplane PCBA 40 and support plate 48 can be mounting during chassis assembly according to module size.

Figure 6:
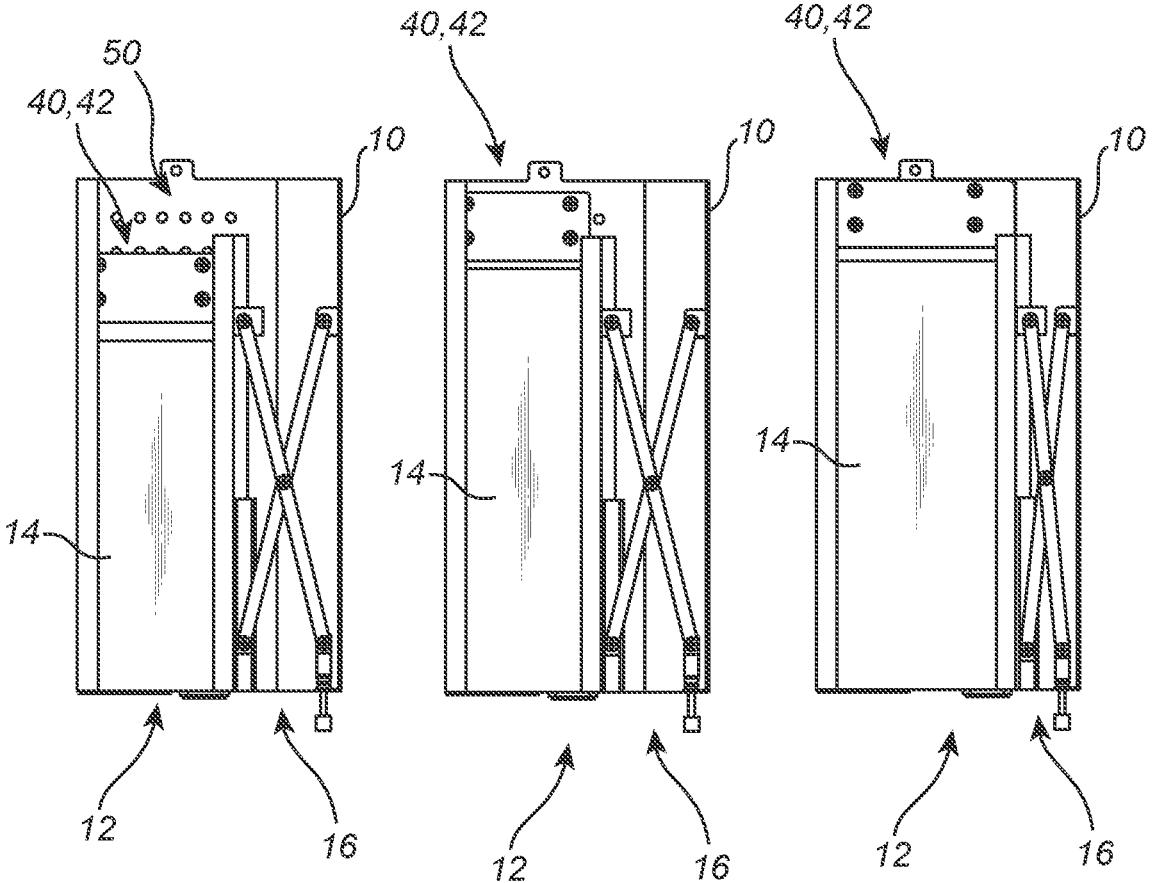
FIG. 6 is a series of planar views of the chassis assembly of the present disclosure adjusted to accommodate a more narrow-more shallow module, a more narrow-deeper module, and a wider-deeper module, respectively, via adjustment of the adjustment mechanism of the adjustable module slot and appropriate placement of the backplane PCBA and edge connector in the rows of holes.

FIG. 6 is a series of planar views of the chassis assembly 10 of the present disclosure adjusted to accommodate a more narrow-more shallow module 14, a more narrow-deeper module 14, and a wider-deeper module 14, respectively, via adjustment of the adjustment mechanism 16 of the adjustable module slot 12 and appropriate placement of the backplane PCBA 40 and edge connector 42 in the rows of holes 50.

Figure 7:
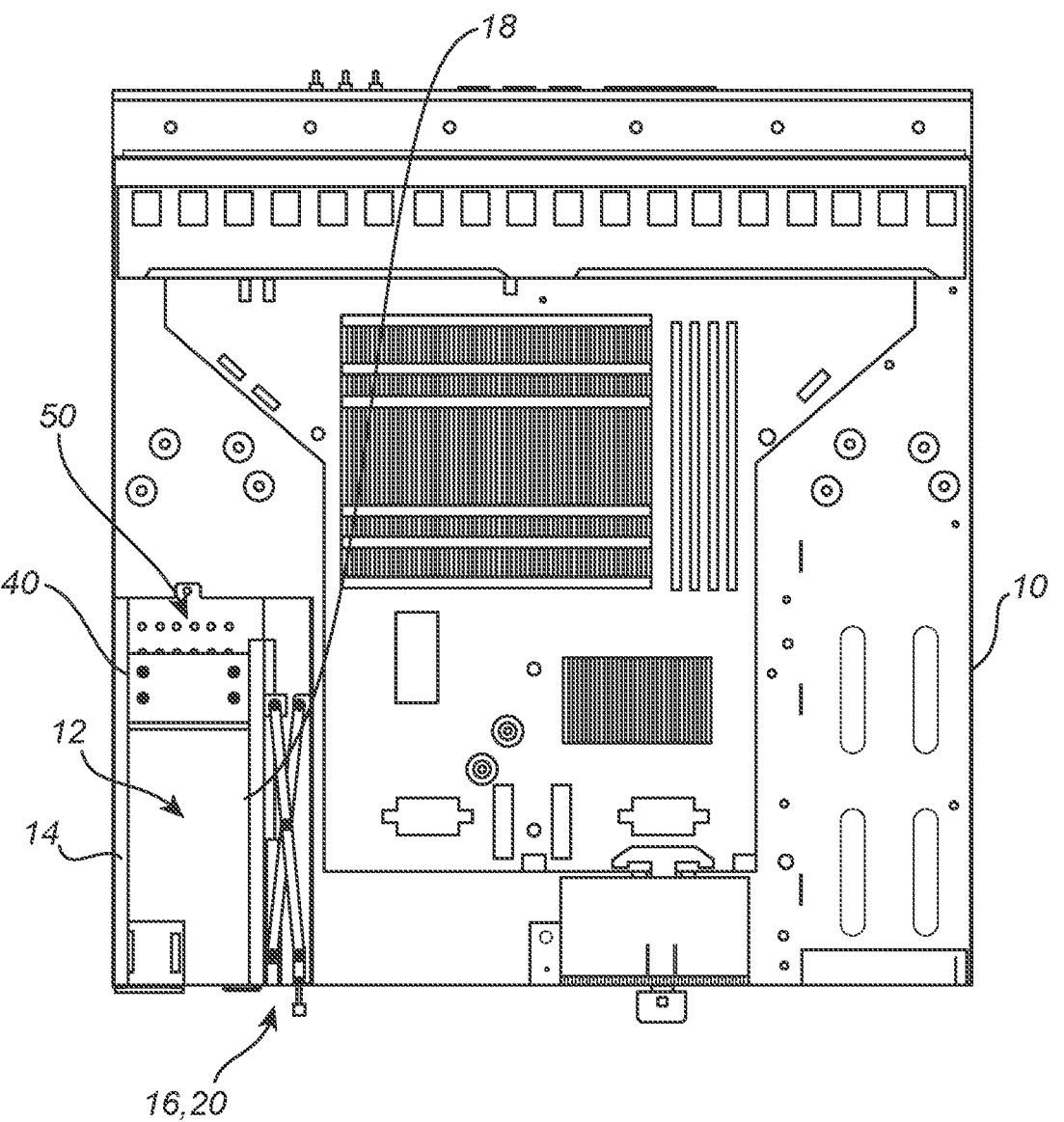
FIG. 7 is a planar view of the partial chassis assembly, adjustable module slot, and adjustment mechanism of the present disclosure, with an associated module inserted into the module slot.

FIG. 7 is a planar view of the chassis assembly 10, adjustable module slot 12, and adjustment mechanism 16 of the present disclosure, with an associated module 14 inserted into the module slot 12. Referring to FIGS. 1 and 7, again, the chassis assembly 10 utilizes a module slot 12 that may be adjusted to accommodate different sized modules 14, such as a PSUs or the like. For example, one (lower power, for example) module 14 may be more narrow with a shorter depth, while another (higher power, for example) module 14 may be wider with a longer depth. The adjustable module slot 12 of the chassis assembly 10 of the present disclosure allows these modules 14 to be alternatively accommodated without a redesign of the chassis assembly 10. In general, the chassis assembly 10 forms a housing that is manufactured from a metal or other suitable rigid material, and the adjustable module slot 12 includes bottom, top, and left and right side surfaces forming a cage that is adapted to receive the module 14 therein. The module 14 typically includes a prismatic box structure that is sized to fit within the adjustable module slot 12 in a given configuration.

The adjustable module slot 12 is a adjusted width-wise via an adjustment mechanism 16 incorporated into one side of the module slot 12. Actuation of the adjustment mechanism 16 causes a side wall 18 of the module slot 12 to be translated laterally with respect to the chassis assembly 10, thereby making the module slot 12 more narrow or wider as desired. It will be readily apparent to those of ordinary skill in the art that the adjustment mechanism 16 may be applied to the left side wall 18 of the module slot 12 and/or the right side wall 18 of the module slot 12. If a partial bottom wall and/or top wall is/are utilized, forming a flange or flanges of the side wall 18, this partial bottom wall and/or top wall may be translated laterally with respect to the chassis assembly 10 with the side wall(s) 18. It will be readily apparent to those of ordinary skill in the art that similar vertical adjustment could be provided as well if desired.

In the embodiment illustrated, the adjustment mechanism 16 includes a scissor mechanism 20, but it will be readily apparent to those of ordinary skill in the art that other similar types of adjustment mechanisms may be used equally. The scissor mechanism 20 includes a pair of scissor links 22*a* and 22*b* joined at a central pivot 24. One end of the first scissor link 22*a* is pivotably coupled to a slider 26 that is able to translate longitudinally along a guide rail 28 coupled to the translating side wall 18 of the module slot 12. As illustrated, the translating side wall 18 includes a partial bottom wall 30*a* and partial top wall 30*b*, forming flanges of the side wall 18, that constrain the retained module 14 and are translated laterally with respect to the chassis assembly 10 with the side wall 18. Another end of the first scissor link 22*a* is pivotably coupled to the chassis assembly 10 outside the cage of the module slot 12. One end of the second scissor link 22*b* is pivotably coupled to a support bracket 32 that is able to translate longitudinally with rotation of a thumb screw 34 disposed through/proximate the front surface of the chassis assembly 10 outside the cage of the module slot 12. Another end of the second scissor link 22*b* is pivotably coupled to the guide rail 28 coupled to the translating side wall 18 of the module slot 12 or a tab of the side wall 18 itself. Thus, each of the scissor links 22*a* and 22*b* is coupled and extensible between the chassis assembly 10 and the translating side wall 18 of the module slot 12. With one point of contact of each of the scissor links 22*a* and 22*b* being pivotable but fixed and one point of contact of each of the scissor links 22*a* and 22*b* being pivotable and translatable. One of these translatable points of contact is actuatable by the thumb screw 34, or a similar translation mechanism, and the other of these translatable points of contact is a passive follower.

Thus, the chassis assembly 10 utilizes a module slot 12 that includes a width adjustment mechanism 16, such as this scissor mechanism 20, that allows for different modules 14 to be accommodated and received in different desired applications. Also illustrated are the chassis holes 50 and movable backplane PCBA 40 that allow for depth adjustment of the chassis connection at the rear of the module 14.

Figure 8:
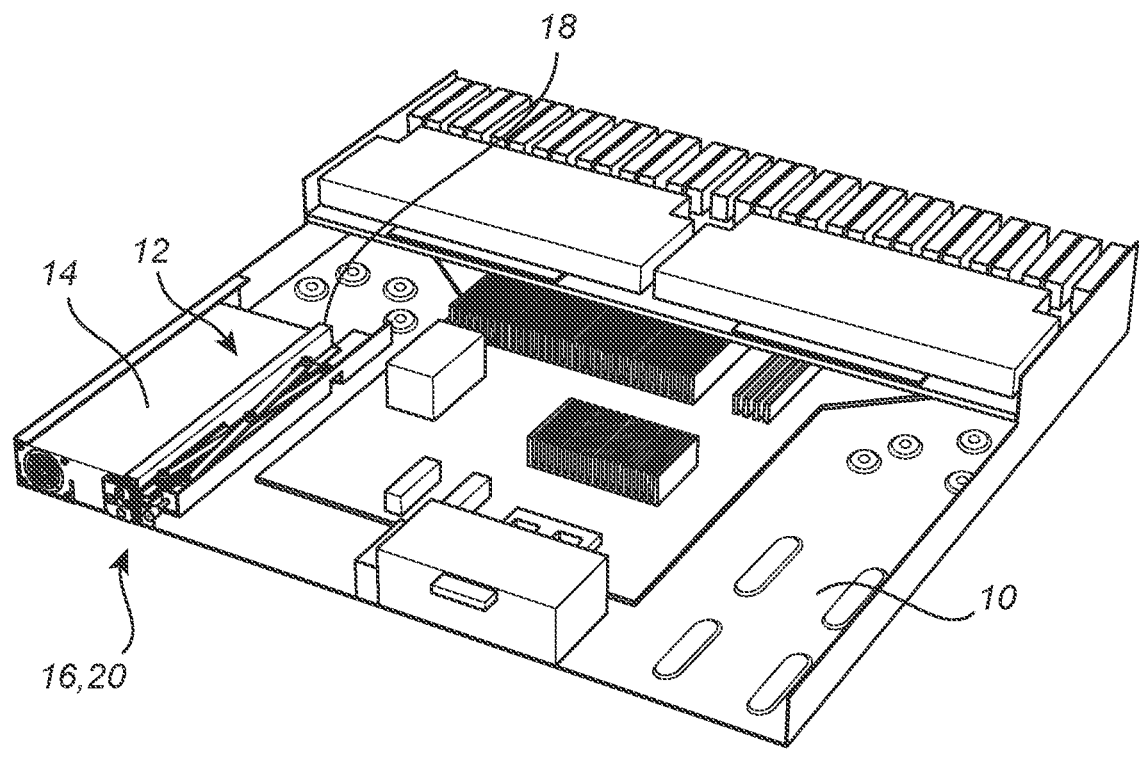
FIG. 8 is a perspective view of the partial chassis assembly, adjustable module slot, and adjustment mechanism of the present disclosure, with an associated module inserted into the module slot.

FIG. 8 is a perspective view of the chassis assembly 10, adjustable module slot 12, and adjustment mechanism 16 of the present disclosure, with an associated module 14 inserted into the module slot 12. Referring to FIGS. 1 and 8, again, the chassis assembly 10 utilizes a module slot 12 that may be adjusted to accommodate different sized modules 14, such as a PSUs or the like. For example, one (lower power, for example) module 14 may be more narrow with a shorter depth, while another (higher power, for example) module 14 may be wider with a longer depth. The adjustable module slot 12 of the chassis assembly 10 of the present disclosure allows these modules 14 to be alternatively accommodated without a redesign of the chassis assembly 10. In general, the chassis assembly 10 forms a housing that is manufactured from a metal or other suitable rigid material, and the adjustable module slot 12 includes bottom, top, and left and right side surfaces forming a cage that is adapted to receive the module 14 therein. The module 14 typically includes a prismatic box structure that is sized to fit within the adjustable module slot 12 in a given configuration.

The adjustable module slot 12 is a adjusted width-wise via an adjustment mechanism 16 incorporated into one side of the module slot 12. Actuation of the adjustment mechanism 16 causes a side wall 18 of the module slot 12 to be translated laterally with respect to the chassis assembly 10, thereby making the module slot 12 more narrow or wider as desired. It will be readily apparent to those of ordinary skill in the art that the adjustment mechanism 16 may be applied to the left side wall 18 of the module slot 12 and/or the right side wall 18 of the module slot 12. If a partial bottom wall and/or top wall is/are utilized, forming a flange or flanges of the side wall 18, this partial bottom wall and/or top wall may be translated laterally with respect to the chassis assembly 10 with the side wall(s) 18. It will be readily apparent to those of ordinary skill in the art that similar vertical adjustment could be provided as well if desired.

In the embodiment illustrated, the adjustment mechanism 16 includes a scissor mechanism 20, but it will be readily apparent to those of ordinary skill in the art that other similar types of adjustment mechanisms may be used equally. The scissor mechanism 20 includes a pair of scissor links 22*a* and 22*b* joined at a central pivot 24. One end of the first scissor link 22*a* is pivotably coupled to a slider 26 that is able to translate longitudinally along a guide rail 28 coupled to the translating side wall 18 of the module slot 12. As illustrated, the translating side wall 18 includes a partial bottom wall 30*a* and partial top wall 30*b*, forming flanges of the side wall 18, that constrain the retained module 14 and are translated laterally with respect to the chassis assembly 10 with the side wall 18. Another end of the first scissor link 22*a* is pivotably coupled to the chassis assembly 10 outside the cage of the module slot 12. One end of the second scissor link 22*b* is pivotably coupled to a support bracket 32 that is able to translate longitudinally with rotation of a thumb screw 34 disposed through/proximate the front surface of the chassis assembly 10 outside the cage of the module slot 12. Another end of the second scissor link 22*b* is pivotably coupled to the guide rail 28 coupled to the translating side wall 18 of the module slot 12 or a tab of the side wall 18 itself. Thus, each of the scissor links 22*a* and 22*b* is coupled and extensible between the chassis assembly 10 and the translating side wall 18 of the module slot 12. With one point of contact of each of the scissor links 22a and 22b being pivotable but fixed and one point of contact of each of the scissor links 22a and 22b being pivotable and translatable. One of these translatable points of contact is actuatable by the thumb screw 34, or a similar translation mechanism, and the other of these translatable points of contact is a passive follower.

Thus, the chassis assembly 10 utilizes a module slot 12 that includes a width adjustment mechanism 16, such as this scissor mechanism 20, that allows for different modules 14 to be accommodated and received in different desired applications.

The thumb screw adjustable scissor mechanism and other adjustment mechanisms that may be used help to accommodate different widths of CRPS or custom PSUs or other modules without chassis redesign. The adjustable backplane with screw holes at multiple locations accommodates different depths of CRPS or custom PSUs or other modules. Thus, based on product configurations, PSUs or other modules can be chosen to optimize cost without chassis redesign. Different sizes of PSUs can be accommodated using a single directional adjustment without impacting reliability. The sliding plate utilized helps to grip the PSU tightly once installed and protects it from vibration and shock. This eliminates the need for an additional thumb screw or the like on the PSU which helps to mount the PSU on the chassis and further simplifies the PSU design. Flexibility to use PSUs from different vendors is provided without redesigning the chassis. This helps reduce supply chain risk for custom projects in case of obsolesce and improves price negotiation leverage. The use of a lower or higher power PSU post chassis design may depend on actual board power usage. This enables manufacturing and inventory cost savings and reduces unnecessary weight. Next generation PSUs with better efficiency may be used in existing systems. Design cycle times are significantly reduced by reusing chassis designs for new designs with different PSU power levels. Reduced EMI after a system is optimized is provided by using a lower power PSU where possible.

Figure 9:
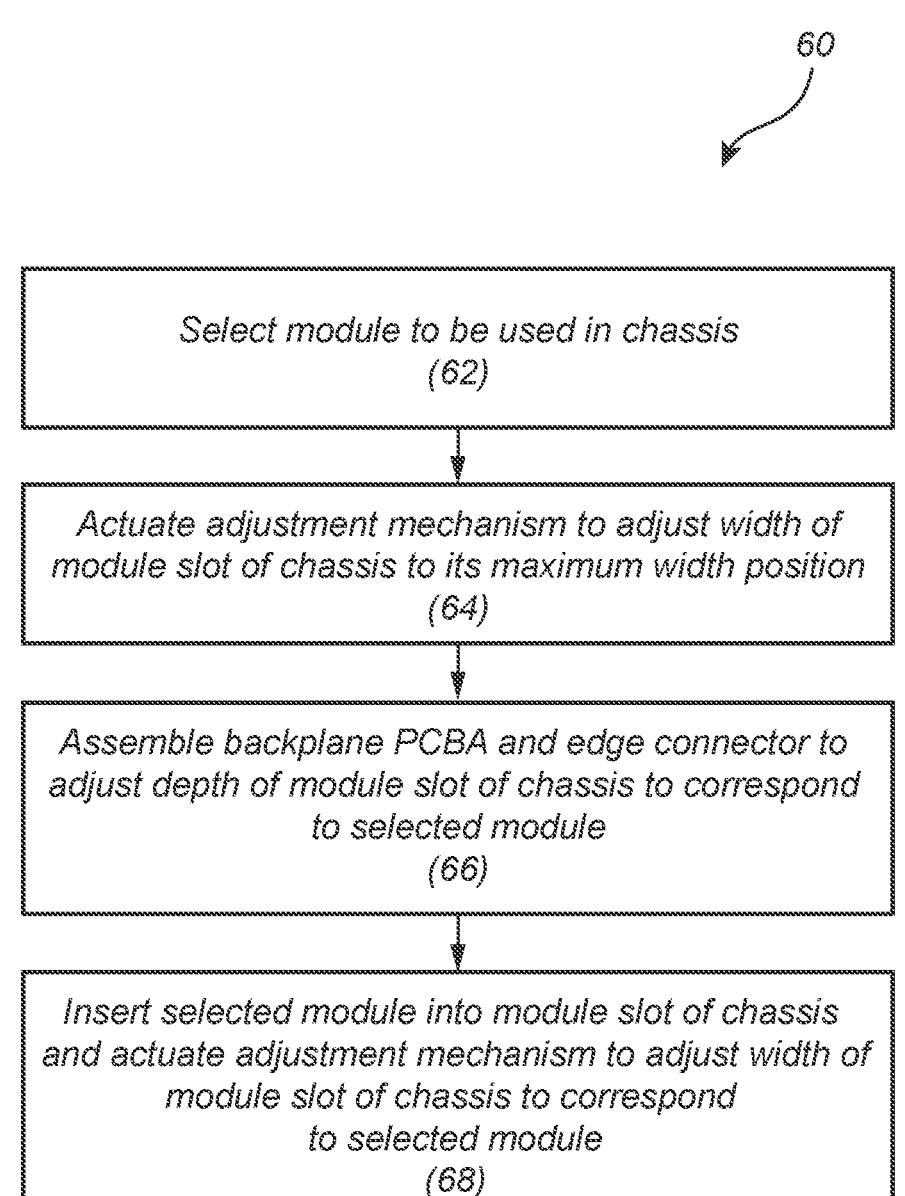
FIG. 9 is a flowchart of one embodiment of the chassis assembly methodology of the present disclosure.

Referring now specifically to FIG. 9, the method 60 for using the chassis assembly of the present disclosure includes first select module to be used in the chassis assembly (step 62). This may, for example, involve deciding that a smaller PSU can be used in a given network application. The method 60 then includes actuating the adjustment mechanism to adjust the width of the module slot of the chassis assembly to its maximum width position (step 64). The method 60 also includes assembling the backplane PCBA and edge connector to adjust the depth of the module slot of the chassis assembly to correspond to the selected module (step 66). Finally, the method 60 includes inserting the selected module into the module slot of chassis assembly and actuating the adjustment mechanism to adjust the width of the module slot of the chassis to correspond to the selected module (step 68), with the connector of the module making connection with the pre-positioned backplane PCBA and edge connector of the chassis assembly.

Although the present disclosure is illustrated and described with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following non-limiting claims for all purposes.

What is claimed is:

1. A chassis assembly for network equipment, the chassis assembly comprising:
   a module slot comprising a bottom wall, a top wall, and a pair of side walls adapted to receive a module therein; and
   an adjustment mechanism adapted to translate at least one of the pair of side walls laterally towards or away from another of the pair of side walls to adjust a width of the module slot to conform to a width of the module such that each of the pair of side walls abuts a corresponding side of the module and constrains the module in an adjusted configuration when the module is received therein.

2. The chassis assembly of claim 1, wherein one or more of the bottom wall and the top wall is a partial wall that is translated with the at least one of the pair of side walls.

3. The chassis assembly of claim 1, wherein the adjustment mechanism is a scissor mechanism comprising a first scissor link pivotably coupled to a second scissor link.

4. The chassis assembly of claim 3, wherein one end of the first scissor link is pivotably and longitudinally translatably coupled to a guide rail coupled to the at least one of the pair of side walls and another end of the first scissor link is pivotably coupled to the chassis assembly.

5. The chassis assembly of claim 3, wherein one end of the second scissor link is pivotably and longitudinally translatably coupled to the chassis assembly and another end of the second scissor link is pivotably coupled to the guide rail coupled to the at least one of the pair of side walls.

6. The chassis assembly of claim 5, wherein the one end of the second scissor link is pivotably and longitudinally translatably coupled to the chassis assembly via a thumb screw and a support bracket, wherein the support bracket is adapted to convert rotational motion of the thumb screw to longitudinal translational motion of the one end of the second scissor link.

7. The chassis assembly of claim 1, the module slot further comprising a backplane printed circuit board assembly and an edge connector adapted to receive a module connector disposed at a rear portion of the module.

8. The chassis assembly of claim 7, wherein a chassis structure forming a bottom of the module slot defines multiple rows of holes adapted to receive the backplane printed circuit board assembly and the edge connector at different depths within the module slot.

9. A chassis assembly for network equipment, the chassis assembly comprising:
   a module slot comprising a bottom wall, a top wall, and a pair of side walls adapted to receive a module therein;
   an adjustment mechanism adapted to translate at least one of the pair of side walls laterally towards or away from another of the pair of side walls to adjust a width of the module slot to conform to a width of the module such that each of the pair of side walls abuts a corresponding side of the module and constrains the module in an adjusted configuration when the module is received therein; and
   a backplane printed circuit board assembly and an edge connector adapted to receive a module connector disposed at a rear portion of the module, wherein the backplane printed circuit board assembly and the edge connector are adapted be moved longitudinally to adjust a depth of the module slot to conform to a depth of the module.

10. The chassis assembly of claim 9, wherein one or more of the bottom wall and the top wall is a partial wall that is translated with the at least one of the pair of side walls.

11. The chassis assembly of claim 9, wherein the adjustment mechanism is a scissor mechanism comprising a first scissor link pivotably coupled to a second scissor link.

12. The chassis assembly of claim 11, wherein one end of the first scissor link is pivotably and longitudinally translatably coupled to a guide rail coupled to the at least one of the pair of side walls and another end of the first scissor link is pivotably coupled to the chassis assembly.

13. The chassis assembly of claim 11, wherein one end of the second scissor link is pivotably and longitudinally translatably coupled to the chassis assembly and another end of the second scissor link is pivotably coupled to the guide rail coupled to the at least one of the pair of side walls.

14. The chassis assembly of claim 13, wherein the one end of the second scissor link is pivotably and longitudinally translatably coupled to the chassis assembly via a thumb screw and a support bracket, wherein the support bracket is adapted to convert rotational motion of the thumb screw to longitudinal translational motion of the one end of the second scissor link.

15. The chassis assembly of claim 9, wherein a chassis structure forming a bottom of the module slot defines multiple rows of holes adapted to receive the backplane printed circuit board assembly and the edge connector at different depths within the module slot.

16. A method, comprising:

receiving a module in a module slot of a chassis assembly, wherein the module slot comprises a bottom wall, a top wall, and a pair of side walls; and adjusting, based on a width of the module, a width of the module slot using an adjustment mechanism adapted to translate at least one of the pair of side walls laterally towards or away from another of the pair of side walls such that each of the pair of side walls abuts a corresponding side of the module and constrains the module in an adjusted configuration when the module is received therein.

17. The method of claim 16, wherein the adjustment mechanism is a scissor mechanism comprising a first scissor link pivotably coupled to a second scissor link.

18. The method of claim 17, wherein:

one end of the first scissor link is pivotably and longitudinally translatably coupled to a guide rail coupled to the at least one of the pair of side walls and another end of the first scissor link is pivotably coupled to the chassis assembly;

one end of the second scissor link is pivotably and longitudinally translatably coupled to the chassis assembly and another end of the second scissor link is pivotably coupled to the guide rail coupled to the at least one of the pair of side walls; and the one end of the second scissor link is pivotably and longitudinally translatably coupled to the chassis assembly via a thumb screw and a support bracket, wherein the support bracket is adapted to convert rotational motion of the thumb screw to longitudinal translational motion of the one end of the second scissor link.

19. The method of claim 16, wherein the module is a power supply unit configured to fulfill a power requirement of network equipment.

20. The method of claim 19, wherein:

an amount of the adjustment of the width of the module slot is based on a size of the power supply unit, and the size of the power supply unit is based on the power requirement of the network equipment.

* * * * *